(12) United States Patent
Forel et al.

(10) Patent No.: US 6,377,115 B1
(45) Date of Patent: Apr. 23, 2002

(54) INTEGRATED POTENTIOMETER AND CORRESPONDING FABRICATION PROCESS

(75) Inventors: Christophe Forel, Annonay; Sebastien Laville, Grenoble; Christian Dufaza, St. Pargoire; Daniel Auvergne, Montferrier Surlez, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/678,711

(22) Filed: Oct. 4, 2000

(30) Foreign Application Priority Data

Oct. 5, 1999 (FR) .............................................. 99 12381

(51) Int. Cl.[7] .......................................... H03K 17/687
(52) U.S. Cl. ........................ 327/580; 327/581; 327/427
(58) Field of Search ................................ 327/580, 581, 327/427, 432, 434, 435, 574, 579

(56) References Cited

U.S. PATENT DOCUMENTS

| | | | | |
|---|---|---|---|---|
| 3,818,245 A | * | 6/1974 | Suzuki | 327/546 |
| 3,893,085 A | | 7/1975 | Hansen | 327/581 |
| 4,146,902 A | | 3/1979 | Tanimoto et al. | 257/381 |
| 5,270,533 A | * | 12/1993 | Pulice | 327/362 |
| 5,914,628 A | * | 6/1999 | Rault | 327/452 |

FOREIGN PATENT DOCUMENTS

EP 0 656 690 A2 6/1995

OTHER PUBLICATIONS

Pan T–W et al. "A 50–dB Variable Gain Amplifier Using Parasitic Bipolar Transistors in CMOS", IEEE Journal of Solid–State Circuits, vol. 24, No. 4, Aug. 1, 1989, pp. 951–961, XP000066223.
French Search Report dated Jun. 21, 2000 with Annex to French Application No. 99–12381.

* cited by examiner

*Primary Examiner*—Toan Tran
(74) *Attorney, Agent, or Firm*—Lisa K. Jorgenson; Jose Gutman; Fleit, Kain, Gibbons, Gutman & Bongini P.L.

(57) ABSTRACT

A process and an integrated circuit are intended for obtaining an adjustable electrical resistance, in which a first voltage is applied to an integrated MOS transistor on its source, its gate and its substrate, and a second voltage is applied on its drain, the first and second voltages being able to initiate a breakdown of the MOS transistor by:

avalanche of the drain/substrate junction;

biasing of the parasitic bipolar transistor of the MOS transistor;

irreversible breakdown of the drain/substrate junction; and shorting between the drain and the source.

14 Claims, 2 Drawing Sheets

INTEGRATED POTENTIOMETER AND CORRESPONDING FABRICATION PROCESS

CROSS-REFERENCE TO RELATED APPLICATIONS

This application is based upon and claims priority from prior French Patent Application No. 99-12381, filed Oct. 5, 1999, the entire disclosure of which is herein incorporated by reference.

BACKGROUND OF THE INVENTION

1. Field of the Invention

The present invention generally relates to the field of analog and digital integrated circuits, and more particularly to a process for obtaining an adjustable electrical resistance applied to an integrated circuit component.

2. Description of the Prior Art

In actual fact, the applicant has noticed that the accuracy which is excellent during the step of sorting the silicon wafers, that is to say of eliminating wafers exhibiting defects, may be degraded during the subsequent encapsulation step. By way of example, for an operational amplifier, during the sorting of the wafers one may find offset voltages of the order of 2 mV which, after adjustment, are reduced to 1 mV. In actual fact, encapsulation by insertion into a package creates additional drifting which modifies the final offset voltage to 1.5 mV. For a voltage reference or a voltage regulator, when sorting the wafers, the accuracy is 0.8%, modified to 0.2% after adjustment. As in the case of the amplifier, a drift which modifies the final accuracy to 0.5% is introduced on insertion into the package.

Additionally, these circuits must use the smallest possible area of silicon so as to cut costs while retaining high accuracy which has been problematic in the past.

Accordingly, there exists a need for overcoming the disadvantages of the prior art as discussed above.

SUMMARY OF THE INVENTION

According to a preferred embodiment of the present invention, a preferred implementation will remedy the drawbacks of the prior art as discussed above. A preferred embodiment of the present invention proposes to adjust integrated circuits after they have been inserted into their package, especially the standard integrated circuits produced in large batches at low cost. The aim is to obtain very high accuracy, at least equal to that obtained after adjustment during the sorting of the wafers.

The process, according to the invention, is intended for obtaining an adjustable electrical resistance, in which a first voltage is applied to an integrated MOS transistor on its source, its gate and its substrate, and a second voltage is applied on its drain, the first and second voltages being able to initiate a breakdown of the MOS transistor by:

avalanche of the drain/substrate junction, biasing of the parasitic bipolar transistor of the MOS transistor, irreversible breakdown of the drain/substrate junction, shorting between the drain and the source.

Advantageously, the electrical resistance obtained is adjustable in a unidirectional manner, its value being determined by the current due to the first and second voltages and being modifiable by application of other voltages with a higher current limitation, the first and second voltages being provided by a generator with current limitation.

In one embodiment of the invention, one of the first and second voltages is constant, and the other voltage is a monotonically varying ramp.

In one embodiment of the invention, the application of the first and second voltages takes place before a step of encapsulation of a circuit of which the MOS transistor forms part.

In another embodiment of the invention, the application of the first and second voltages takes place after a step of encapsulation of a circuit of which the MOS transistor forms part. The control of the breakdown of the MOS transistor can be effected via the conventional pins of the integrated circuit: ground, power supply, input(s), output(s).

A preferred embodiment of the present invention provides an integrated active electronic component, comprising a MOS transistor. The MOS transistor is caused to break down by avalanche of the drain/substrate junction, biasing of the parasitic bipolar transistor of the MOS transistor, irreversible breakdown of the drain/substrate junction, and shorting between the drain and the source, in such a way that the component forms an adjustable resistance of value determined by the current due to the voltage difference between the drain and the source of the MOS transistor.

According to a preferred embodiment of the present invention, an electronic circuit comprises at least two components of the type described above so as to form a bidirectionally adjustable electrical resistance.

In one embodiment of the invention, the electronic circuit comprises a MOS transistor, a first component of the type described above, arranged in parallel between the drain and the source of the MOS transistor, a second component of the type described above, arranged between the gate of the MOS transistor and ground, and a current source arranged between the gate and the power supply.

The invention therefore makes it possible to propose standard integrated circuits of increased accuracy. The use of so-called "snap-back" MOS transistors makes it possible to obtain shorting and hence to vary a resistance inside an integrated circuit after its encapsulation by acting on the conventional pins of the integrated circuit. The component thus produced occupies little room on a silicon wafer in the sense that it comprises just a single MOS transistor. The fact that the gate and the source of the MOS transistor are short-circuited guarantees that it is permanently off and prevents it from influencing the operation of the adjacent electronic circuits.

The invention harnesses a natural characteristic of MOS transistors, namely that they possess parasitic components, in particular a bipolar transistor. In certain configurations, these parasitic components are harmful. During electrostatic discharges, circuits may be seriously damaged by the turning on of the parasitic transistor. Conversely, the invention uses the parasitic bipolar transistor of the MOS transistor to cause shorting thereof and to vary the resistance between the drain and the source of the MOS transistor, that is to say between the collector and the emitter of the parasitic bipolar transistor.

BRIEF DESCRIPTION OF THE DRAWINGS

The present invention will be better understood on studying the detailed description of a few embodiments taken by way of wholly non-limiting examples and illustrated by the appended drawings, in which.

DESCRIPTION OF THE PREFERRED EMBODIMENTS

Figure 1:
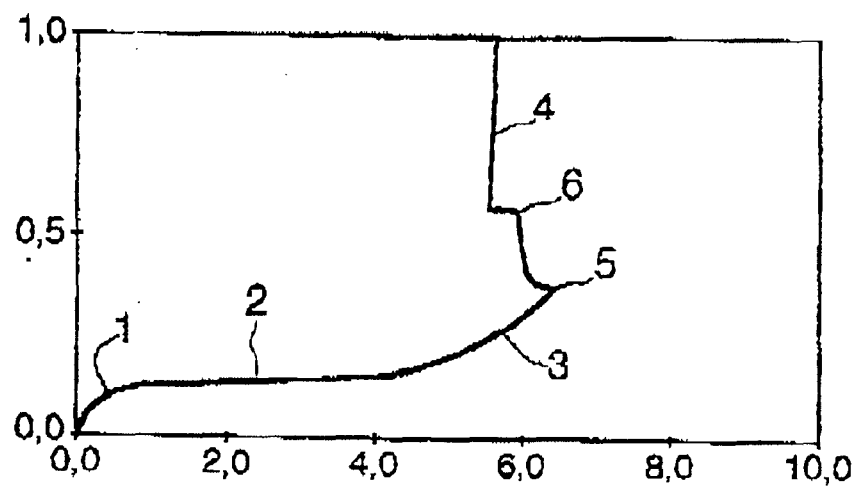
FIG. 1 is a conventional characteristic operating curve for an NMOS transistor.

As may be seen in FIG. 1, where the drain voltage appears along the abscissa and the drain current along the ordinate, an NMOS transistor possesses four operating regions. Region 1 is that of the conventional linear operation of a MOS transistor. Region 2 is that of the operation in the saturated regime where the current varies only very weakly as a function of voltage. Region 3 is the so-called "avalanche" region with a weakening of the drain/substrate junction, caused by the avalanche of the said junction. Finally, region 4 is that of the turning on of the parasitic bipolar transistor with on the curve a first breakdown referenced 5 which is reversible and a second breakdown referenced 6 which is destructive and hence irreversible.

Beyond the second breakdown 6, one observes that the current varies extremely rapidly as a function of voltage, the slope of the curve being almost vertical. The breakdown process also referred to as "second breakdown" being irreversible, it is possible to move over the curve, starting from the second breakdown 6 and moving upwards, this translating into a decrease in the resistance exhibited by the MOS transistor which has been caused to break down in this way, in so far as for a substantially constant drain voltage, one sees that the current increases.

Figure 2:
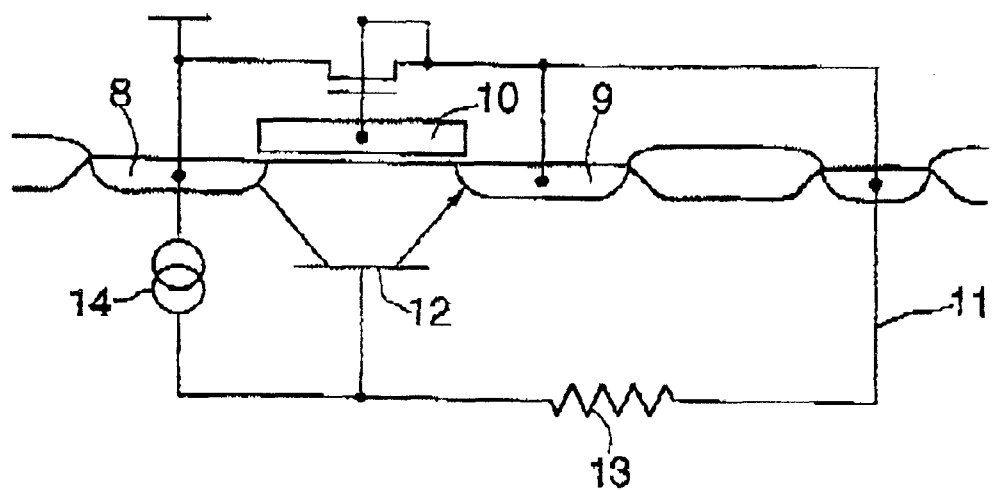
FIG. 2 is a transverse sectional view of a MOS transistor.
Figure 3:
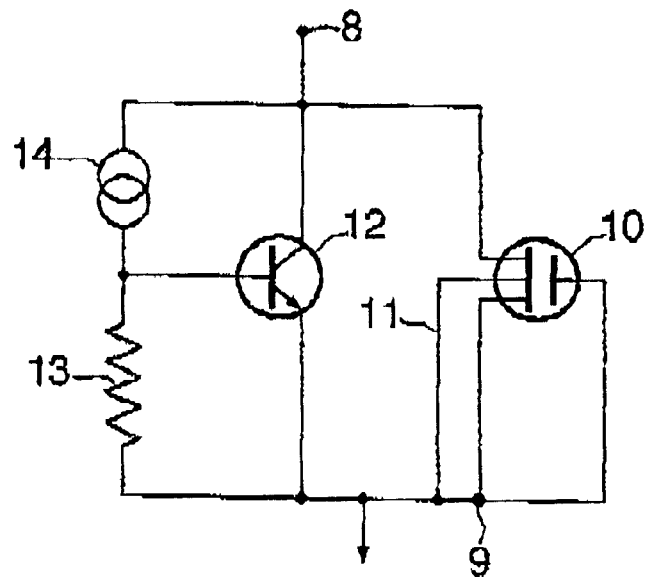
FIG. 3 is a diagram modelling the MOS transistor and its parasitic bipolar transistor.

Represented in FIGS. 2 and 3 is the structure of the various constituents. The MOS transistor comprises a drain 8, a source 9 and a gate 10 which are formed on a substrate 11. A parasitic bipolar transistor 12 whose collector is formed by the drain 8, whose emitter is formed by the source 9 and whose base can be modelled as being grounded via a substrate resistance 13 and via a current source 14 linked to the drain 8, is formed in the substrate 11.

In the arrangement according to the invention, the drain 8 is linked to a first supply voltage, whilst the source 9, the gate 10 and the substrate 11 are short-circuited and linked to a second supply voltage. From the saturation regime of the MOS transistor, a high voltage on the drain triggers the avalanche of the drain/substrate junction by generating electron-hole pairs, thus creating a substrate current. The voltage across the substrate resistance increases, thus biasing the source/substrate junction. The parasitic bipolar transistor is thus initiated and the breakdown phenomenon then occurs.

At high current, the component enters the regime of irreversible second breakdown which translates into destruction of the polysilicon crystalline network of the channel formed between the drain and the source. After avalanche of the collector-base junction of the parasitic bipolar transistor, the grounded emitter makes it possible to place the base-emitter junction in forward mode, thereby engendering the snap-back effect. To trigger the avalanche phenomenon, a sufficient voltage must be imposed on the drain as to place the drain/substrate junction in reverse mode. This voltage depends on the doping characteristics and is proportional to the square of the electric field.

The current generator 14 which has been represented in FIGS. 2 and 3 between the collector and the base of the parasitic bipolar transistor simulates firstly the drain/substrate junction leakage currents. Subsequently, it makes it possible to simulate the junction avalanche and the biasing of the NPN-type parasitic bipolar transistor.

By way of example, trials have been carried out in HF4 CMOS technology with an NMOS transistor whose channel has the following dimensions: width=1 $\mu$m, length=0.7 $\mu$m. The source is grounded and a voltage ramp varying from 8 to 18 volts with current limitation is applied to the drain. For a current of 2 mA, a resistance after breakdown of 300 Ohms is formed. For a current of 10 mA, a resistance after breakdown of 60 Ohms is obtained and for a current of 100 mA, a resistance after breakdown of 11 Ohms is obtained. It is observed that for a drain voltage of less than 11 volts, the drain/substrate junction does not avalanche, hence no current passes through the drain/source channel. Beyond this voltage, the phenomenon is triggered with the creation of a conducting path allowing the current to pass. Having reached the breakdown voltage, all the available current passes through the channel and a resistance is created.

It is especially beneficial to use transistors whose channel is as short as possible, in so far as the shorter the channel, the lower the breakdown voltage, by reason of the increase in the drain current and of the increase in the number of electron-hole pairs generated, for constant channel width. A reduction in the channel width translates into a reduction in the voltage and in the current of the second breakdown 6 illustrated in FIG. 1. Even if the width of the channel is not involved in the voltage of the first breakdown 5, a decreased width will increase the thermal effect of the second breakdown 6 since the field lines are then more unidirectional, implying a reduction in the couple of the second breakdown. It is therefore especially beneficial to use MOS transistors of small dimensions.

In practice, the adjusting of the resistance created by the breakdown of the MOS in an integrated circuit after encapsulation will have to be performed via the conventional pins used for the inputs, the outputs, the power supply and the ground without providing additional pins which would be expensive and subsequently needless. Provision may therefore be made to impose a constant positive voltage on the supply and to impose a negative voltage ramp on the ground with current limitation so as to create the resistance of the desired value. Such a resistance may be arranged for example at each input of an operational amplifier so as to allow the balancing thereof.

Figure 4:
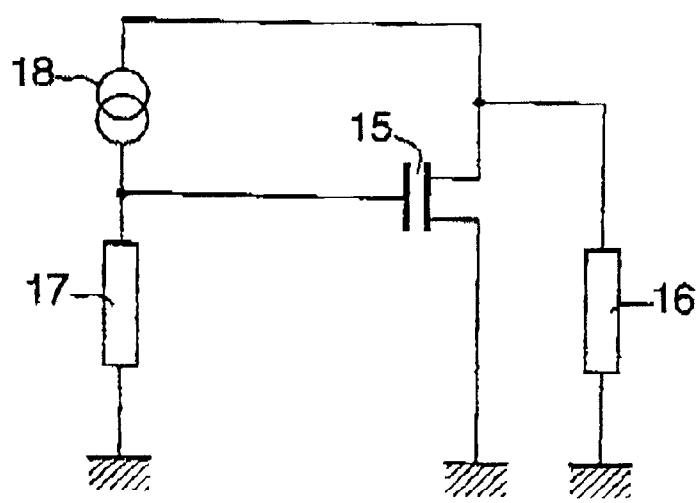
FIG. 4 is a diagram of a circuit implementing a preferred embodiment of the invention.

However, the breakdown phenomenon being irreversible, it is only possible to move within region 4 of the curve of FIG. 1 in the direction of increasing currents, that is to say of decreasing resistances. In certain applications, one wishes to obtain an integrated potentiometer which can be adjusted in both directions by increasing and reducing the resistance. It is then possible to use the circuit illustrated in FIG. 4 where a MOS transistor 15 is used in its linear region with in parallel with this transistor 15 an integrated potentiometer 16 such as described hereinabove and formed by a broken-down MOS transistor, another integrated potentiometer 17 such as described hereinabove being connected between the gate and the source of the MOS transistor 15. A current source 18 links the drain and the gate of the MOS transistor 15.

Thus, a reduction in the resistance of the component 16 translates into a reduction in the resistance of the entire circuit. Conversely, a reduction in the resistance of the component 17 translates into a reduction in the gate voltage of the MOS transistor 15 and an increase in the resistance between the drain and the source of the said MOS transistor 15, the latter being in the linear region.

Of course, this circuit constitutes merely one exemplary arrangement of an integrated bidirectional potentiometer. Other arrangements comprising two integrated potentiometers or more may be envisaged.

The invention thus makes it possible to harness a natural characteristic of MOS transistors which is usually regarded as a drawback in order to produce an integrated potentiometer, the value of whose resistance can be adjusted finely so as to obtain integrated circuits produced in very large batches and exhibiting high accuracy.

While there has been illustrated and described what are presently considered to be the preferred embodiments of the present invention, it will be understood by those of ordinary skill in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for obtaining an adjustable electrical resistance, in which a first voltage is applied to an integrated MOS transistor on its source, its gate and its substrate, and a second voltage is applied on its drain, the first and second voltages being able to initiate a breakdown of the MOS transistor by:

avalanche of the drain/substrate junction;

biasing of the parasitic bipolar transistor of the MOS transistor;

irreversible breakdown of the drain/substrate junction; and shorting between the drain and the source.

2. The method according to claim 1, in which one of the first and second voltages is constant, and the other voltage is a monotonically varying ramp.

3. The method according to claim 1, in which the application of the first and second voltages takes place before a step of encapsulation of a circuit of which the MOS transistor forms part.

4. The method according to claim 1, in which the application of the first and second voltages takes place after a step of encapsulation of a circuit of which the MOS transistor forms part.

5. The method according to claim 4, wherein the control of the breakdown of the MOS transistor is effected via the conventional pins of the integrated circuit: ground, power supply, input(s), output(s).

6. The method according to claim 1, wherein the electrical resistance obtained is adjustable in a unidirectional manner, its value being determined by the current due to the first and second voltages and being modifiable by application of other voltages with a higher current limitation, the first and second voltages being provided by a generator with current limitation.

7. The method according to claim 6, wherein the application of the first and second voltages takes place before a step of encapsulation of a circuit of which the MOS transistor forms part.

8. The method according to claim 6, wherein the application of the first and second voltages takes place after a step of encapsulation of a circuit of which the MOS transistor forms part.

9. The method according to claim 8, wherein the control of the breakdown of the MOS transistor is effected via the conventional pins of the integrated circuit: ground, power supply, input(s), output(s).

10. The method according to claim 6, wherein one of the first and second voltages is constant, and the other voltage is a monotonically varying ramp.

11. The method according to claim 10, wherein the application of the first and second voltages takes place after a step of encapsulation of a circuit of which the MOS transistor forms part.

12. The method according to claim 11, wherein the control of the breakdown of the MOS transistor is effected via the conventional pins of the integrated circuit: ground, power supply, input(s), output(s).

13. The method according to claim 10, wherein the application of the first and second voltages takes place before a step of encapsulation of a circuit of which the MOS transistor forms part.

14. An integrated active electronic component, comprising a MOS transistor, wherein the MOS transistor is caused to break down by avalanche of the drain/substrate junction, biasing of the parasitic bipolar transistor of the MOS transistor, irreversible breakdown of the drain/substrate junction, and shorting between the drain and the source, in such a way that the integrated active electronic component forms an adjustable resistance of value determined by the current due to the voltage difference between the drain and the source of the MOS transistor.

* * * * *